(12) United States Patent
Fujikawa et al.

(10) Patent No.: US 7,867,882 B2
(45) Date of Patent: Jan. 11, 2011

(54) METHOD OF MANUFACTURING SILICON CARBIDE SEMICONDUCTOR DEVICE

(75) Inventors: Kazuhiro Fujikawa, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/444,551

(22) PCT Filed: Aug. 13, 2007

(86) PCT No.: PCT/JP2007/065817
§ 371 (c)(1), (2), (4) Date: Apr. 6, 2009

(87) PCT Pub. No.: WO2008/053628
PCT Pub. Date: May 8, 2008

(65) Prior Publication Data
US 2010/0035411 A1 Feb. 11, 2010

(30) Foreign Application Priority Data
Oct. 30, 2006 (JP) .............................. 2006-294355

(51) Int. Cl.
*H01L 21/265* (2006.01)
(52) U.S. Cl. ................. 438/522; 438/931; 257/E21.085
(58) Field of Classification Search ................. 438/522, 438/530, 518, 931
See application file for complete search history.

(56) References Cited

U.S. PATENT DOCUMENTS

2005/0230686 A1  10/2005  Kojima et al.

FOREIGN PATENT DOCUMENTS

| EP | 2 015 363 A | 1/2009 |
|---|---|---|
| JP | 8-107223 | 4/1996 |
| JP | 11-135450 | 5/1999 |
| JP | 2000-012482 | 1/2000 |
| JP | 2001-068428 | 3/2001 |
| JP | 2004-172556 | 6/2004 |
| JP | 2006-344942 | 12/2006 |

OTHER PUBLICATIONS

Tsuji Takashi, Translation of JP 2000-012482, Jan. 14, 2000.*
Tsuji Takashi, Translation of JP 11-135450, May 21, 1999.*
Seki Akinori, Translation of JP 2004-172556, Jun. 17, 2004.*

* cited by examiner

*Primary Examiner*—Charles D Garber
*Assistant Examiner*—Reema Patel
(74) *Attorney, Agent, or Firm*—Venable LLP; Michael A. Sartori; Michael E. Nelson

(57) ABSTRACT

A method of manufacturing an SiC semiconductor device includes the steps of ion implanting a dopant at least in a part of a surface of an SiC single crystal, forming an Si film on the surface of the ion-implanted SiC single crystal, and heating the SiC single crystal on which the Si film is formed to a temperature not less than a melting temperature of the Si film.

2 Claims, 6 Drawing Sheets

METHOD OF MANUFACTURING SILICON CARBIDE SEMICONDUCTOR DEVICE

TECHNICAL FIELD

The present invention relates to a method of manufacturing a silicon carbide semiconductor device, in particular to a method of manufacturing an SiC semiconductor device free from pollution with carbon, while suppressing a surface roughness caused by step bunching in a stable manner.

BACKGROUND ART

Silicon carbide (SiC) has characteristics that are not seen in silicon (Si). Compared with Si, SiC has a band gap of about 2-3 times wider, a breakdown voltage of about 10 times higher, and a heat conductivity of about 10 times higher. Taking advantage of these characteristics, in recent years, the SiC semiconductor device including the SiC single crystal is expected to be utilized in applications such as a power device which overcomes the physical limitation of the Si semiconductor device including Si or an environment-resistant device which operates at a high temperature.

An example of a method of manufacturing such an SiC semiconductor device is disclosed, for example, in Patent Document 1 (Japanese Patent Laying-Open No. 2001-68428). Hereafter, with reference to FIGS. 14-18, the example of the method of manufacturing the SiC semiconductor device disclosed in Patent Document 1 will be described.

First of all, an epitaxial layer 102 composed of an n type 4H—SiC single crystal is grown epitaxially on an underlying layer 101 which is an 8° off-axis (0001) Si plane composed of an n type 4H—SiC single crystal, and then an oxide film 103 is formed by pyrogenic oxidation on epitaxial layer 102, as shown in the schematic cross sectional view in FIG. 14.

Then, after forming a patterned photoresist film 104 on the surface of oxide film 103, as shown in the schematic cross sectional view in FIG. 15, oxide film 103 exposed through photoresist film 104 is removed by buffered hydrofluoric acid to expose the surface of epitaxial layer 102.

Subsequently, as shown in the schematic cross sectional view in FIG. 16, ion implantation of boron ion 105 is performed at a room temperature on the surface of exposed epitaxial layer 102, to form an impurity region 107 in the surface of epitaxial layer 102.

Then, photoresist film 104 is removed by $O_2$ plasma ashing and oxide film 103 is completely removed by buffered hydrofluoric acid. As shown in the schematic cross sectional view in FIG. 17, a diamond-like carbon film 106 with a thickness of about 100 nm is then formed on the surface of epitaxial layer 102 by an ECR-CVD method using methane.

Annealing is then performed for 30 minutes at 1700° C. in an argon atmosphere to activate the ion-implanted boron.

As shown in the schematic cross sectional view in FIG. 18, diamond-like carbon film 106 is then removed by $O_2$ plasma ashing.

According to the method of manufacturing the SiC semiconductor device of Patent Document 1, the surface roughness caused by step bunching on the surface of epitaxial layer 102, after removal of diamond-like carbon film 106, can be suppressed.

Patent Document 1: Japanese Patent Laying-Open No. 2001-68428

DISCLOSURE OF THE INVENTION

Problems to be Solved by the Invention

In the method of manufacturing the SiC semiconductor device of above-mentioned Patent Document 1, however, diamond-like carbon film 106 cannot sometimes be removed completely, and if diamond-like carbon film 106 cannot be removed completely such a problem occurs that the SiC semiconductor device is polluted with carbon.

Moreover, in the method of manufacturing the SiC semiconductor device of above-mentioned Patent Document 1, it is not easy to form diamond-like carbon film 106 with appropriate density, and if density of diamond-like carbon film 106 is too low such a problem occurs that the surface roughness caused by step bunching cannot be suppressed enough.

In view of the above-mentioned situation, it is an object of the present invention to provide a method of manufacturing an SiC semiconductor device free from pollution with carbon, while suppressing the surface roughness caused by step bunching in a stable manner.

Means for Solving the Problems

The present invention provides a method of manufacturing an SiC semiconductor device, the method including the steps of: ion implanting a dopant in at least a part of a surface of an SiC single crystal; forming an Si film on the surface of the ion-implanted SiC single crystal; and heating the SiC single crystal on which the Si film is formed to a temperature not less than a melting temperature of the Si film. According to the method, an SiC semiconductor device without being polluted with carbon can be manufactured while suppressing the surface roughness caused by step bunching in a stable manner.

Moreover, the present invention provides a method of manufacturing an SiC semiconductor device, the method including the steps of: ion implanting a dopant in at least a part of a surface of an SiC single crystal; heating the ion-implanted SiC single crystal to a temperature not less than a temperature at which the dopant implanted through ion implantation is activated; forming an Si film on the surface of the heated SiC single crystal; and heating the SiC single crystal on which the Si film is formed to a temperature not less than a melting temperature of the Si film. According to the method, an SiC semiconductor device can be manufactured without being polluted with carbon, while suppressing the surface roughness caused by step bunching in a stable manner.

Moreover, the present invention provides a method of manufacturing an SiC semiconductor device, the method including the steps of: ion implanting a dopant in at least a part of a surface of an SiC single crystal; forming an Si film on the surface of the ion-implanted SiC single crystal; and heating the SiC single crystal on which the Si film is formed to a temperature not less than a melting temperature of the Si film and not less than a temperature at which the dopant implanted through ion implantation is activated. According to the method, an SiC semiconductor device can be more efficiently manufactured without being polluted with carbon, while suppressing the surface roughness caused by step bunching in a stable manner.

Effects of the Invention

According to the present invention, it is possible to provide a method of manufacturing an SiC semiconductor device free from pollution with carbon, while suppressing a surface roughness caused by step bunching in a stable manner.

Hence, according to the present invention, the development of a carrier trap, a leak path or an electric field concentration resulting from the surface roughness can be suppressed. Therefore, it is possible to manufacture the SiC semiconductor device with improved reliability.

DESCRIPTION OF THE REFERENCE SIGNS

Figure 1:
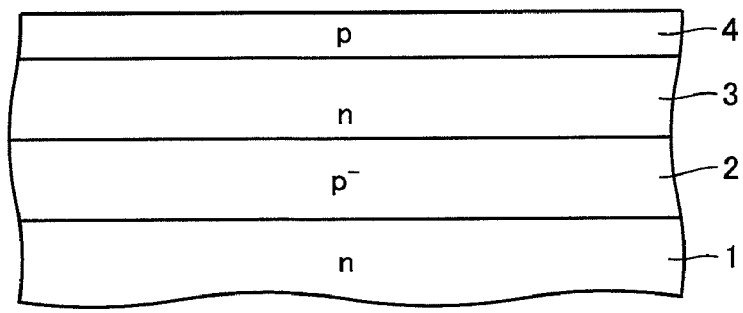
FIG. 1 is a schematic cross sectional view illustrating a part of manufacturing process of an example of the method of manufacturing the SiC semiconductor device according to the present invention.

1 SiC substrate, 2 p$^-$ type SiC layer, 3 n type SiC layer, 4 p type SiC layer, 5a and 5b ion implantation stopper film, 6 and 7 ion implanted region, 6a n$^+$ layer, 7a p$^+$ layer, 8 Si film, 9 sacrifice oxide film, 10 field oxide film, 11a, 11b and 11c ohmic electrode, 12a source electrode, 12b gate electrode, 12c drain electrode, 30a and 30b opening, 101 underlying layer, 102 epitaxial layer, 103 oxide film, 104 photoresist film, 105 boron ion, 106 diamond-like carbon film, 107 impurity region.

BEST MODES FOR CARRYING OUT THE INVENTION

Embodiments of the present invention will be described hereafter. Note that in the figures of the present invention the same or corresponding elements have the same reference characters allotted.

Embodiment 1

With reference to FIGS. 1-12, an example of a method of manufacturing a junction field effect transistor, which is an example of an SiC semiconductor device, will be described hereafter.

First of all, as shown in the schematic cross sectional view in FIG. 1, a p$^-$ type SiC layer 2 composed for example of a p type SiC single crystal serving as a first first-conductivity-type SiC layer, an n type SiC layer 3 composed for example of an n type SiC single crystal serving as a second-conductivity-type SiC layer, and a p type SiC layer 4 composed for example of a p type SiC single crystal serving as a second first-conductivity-type SiC layer are grown epitaxially in this order on an SiC substrate 1 composed of an n type SiC single crystal. Carrier concentration of p$^-$ type SiC layer 2 is set to be lower than carrier concentration of p type SiC layer 4.

Subsequently, as shown in the schematic cross sectional view in FIG. 2, an ion implantation stopper film 5a having an opening 30a in a predetermined region is formed on the surface of p type SiC layer 4, and ions of an n type dopant, such as phosphorus, are ion implanted in the surface of p type SiC layer 4 which is exposed through opening 30a. Thus, an n type dopant ion implanted region 6 is formed on the surface of p type SiC layer 4. Thereafter ion implantation stopper film 5a is removed.

Subsequently, as shown in the schematic cross sectional view in FIG. 3, an ion implantation stopper film 5b having an opening 30b in a region which is different from ion implanted region 6 with an n type dopant ion is formed on the surface of p type SiC layer 4, and ions of a p type dopant, such as aluminum, are ion implanted in the surface of p type SiC layer 4 which is exposed through opening 30b. Thus, a p type dopant ion implanted region 7 is formed in the surface of p type SiC layer 4. Thereafter ion implantation stopper film 5b is removed.

Figure 4:
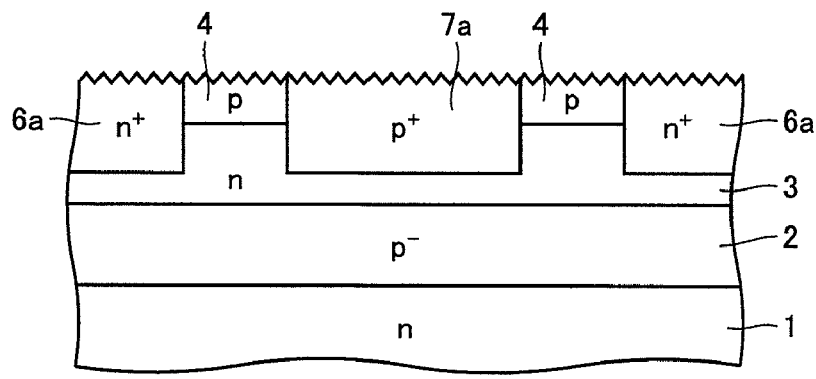
FIG. 4 is a schematic cross sectional view illustrating a part of manufacturing process of an example of the method of manufacturing the SiC semiconductor device of the present invention.

Then, by heating (activation annealing) n type SiC layer 3 and p type SiC layer 4 in an inert gas atmosphere, for example argon, to a temperature not less than a temperature at which the dopant implanted through ion implantation is activated (for example, not less than 1500° C. and not more than 1800° C.), ion implanted region 6 with an n type dopant becomes an n$^+$ layer 6a which functions as an n type layer and ion implanted region 7 with an p type dopant becomes a p$^+$ layer 7a which functions as a p type layer, as shown in the schematic cross sectional view in FIG. 4.

As shown in the schematic cross sectional view in FIG. 4, however, the surface roughness caused by step bunching has occurred after activation annealing on the surfaces of n$^+$ layer 6a, p$^+$ layer 7a and p type SiC layer 4.

Figure 5:
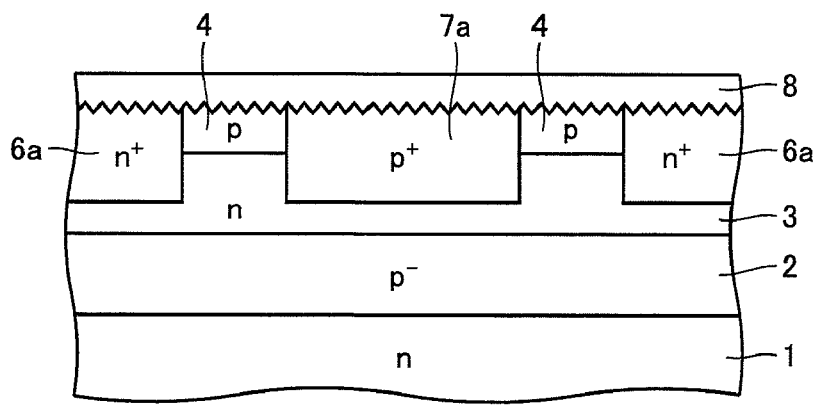
FIG. 5 is a schematic cross sectional view illustrating a part of manufacturing process of an example of the method of manufacturing the SiC semiconductor device of the present invention.

As shown in the schematic cross sectional view in FIG. 5, an Si film 8 is then formed by a sputtering method on the surfaces of n$^+$ layer 6a, p$^+$ layer 7a and p type SiC layer 4, and this Si film 8 and n$^+$ layer 6a, p$^+$ layer 7a and p type SiC layer 4 on which Si film 8 is formed are heated in an inert gas atmosphere, such as argon, to a temperature not less than the melting temperature of Si film 8 (for example, not less than 1300° C. and not more than 1700° C.). Thus recomposition of the surfaces of n$^+$ layer 6a, p$^+$ layer 7a and p type SiC layer 4, using melted Si film 8, is performed and the surfaces of n$^+$ layer 6a, p$^+$ layer 7a and p type SiC layer 4 are recomposed into a step-like smooth surface, as shown in the schematic cross sectional view in FIG. 6. This recomposition is considered to occur because Si is supplied from the melted Si film 8 to the surfaces of n$^+$ layer 6a, p$^+$ layer 7a and p type SiC layer 4 and carbon is supplied from n$^+$ layer 6a, p$^+$ layer 7a and p type SiC layer 4, such that SiC is recomposed at the surfaces of n$^+$ layer 6a, p$^+$ layer 7a and p type SiC layer 4.

Figure 7:
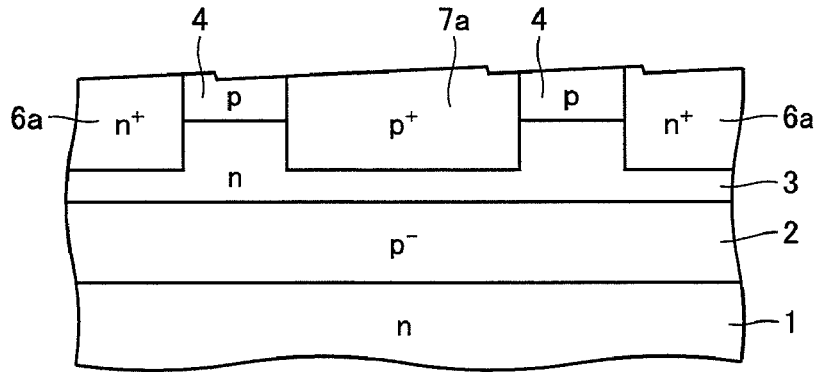
FIG. 7 is a schematic cross sectional view illustrating a part of manufacturing process of an example of the method of manufacturing the SiC semiconductor device of the present invention.

As shown in the schematic cross sectional view in FIG. 7, Si film 8 on the surfaces of n$^+$ layer 6a, p$^+$ layer 7a and p type SiC layer 4 is then removed by being immersed in nitric acid/hydrogen fluoride solution and the like.

Figure 8:
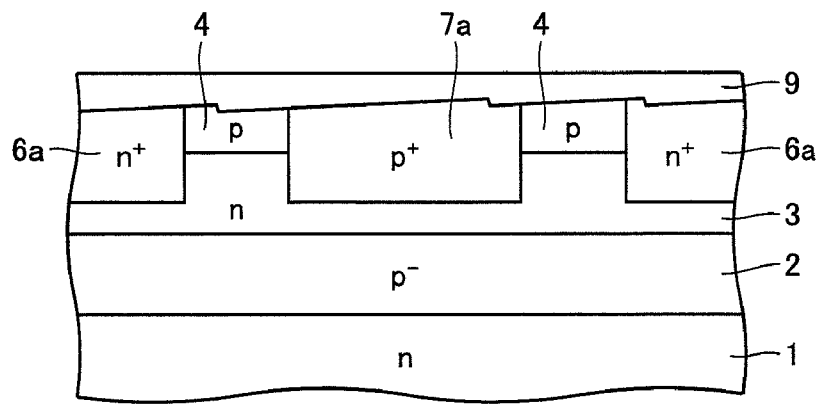
FIG. 8 is a schematic cross sectional view illustrating a part of manufacturing process of an example of the method of manufacturing the SiC semiconductor device of the present invention.

A sacrifice oxide film 9 is then formed on the surfaces of n$^+$ layer 6a, p$^+$ layer 7a and p type SiC layer 4, as shown in the schematic cross sectional view in FIG. 8, by heating the surface of p type SiC layer 4, for example, for 90 minutes at 1150° C. in an oxygen atmosphere. Sacrifice oxide film 9 is then removed from the surfaces of n$^+$ layer 6a, p$^+$ layer 7a and p type SiC layer 4 by being immersed in nitric acid/hydrogen fluoride solution and the like. Thus, the damage so far generated in the process near the surfaces of n$^+$ layer 6a, p$^+$ layer 7a and p type SiC layer 4 can be removed.

Figure 9:
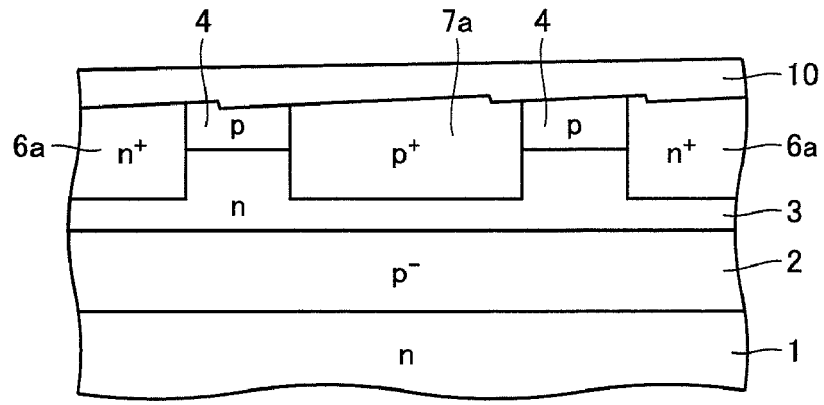
FIG. 9 is a schematic cross sectional view illustrating a part of manufacturing process of an example of the method of manufacturing the SiC semiconductor device of the present invention.

Then a field oxide film 10 is formed on the surfaces of n$^+$ layer 6a, p$^+$ layer 7a and p type SiC layer 4, as shown in the schematic cross sectional view in FIG. 9, by heating the surfaces of n$^+$ layer 6a, p$^+$ layer 7a and p type SiC layer 4 for 40 minutes at 1300° C. in an oxygen atmosphere.

Figure 10:
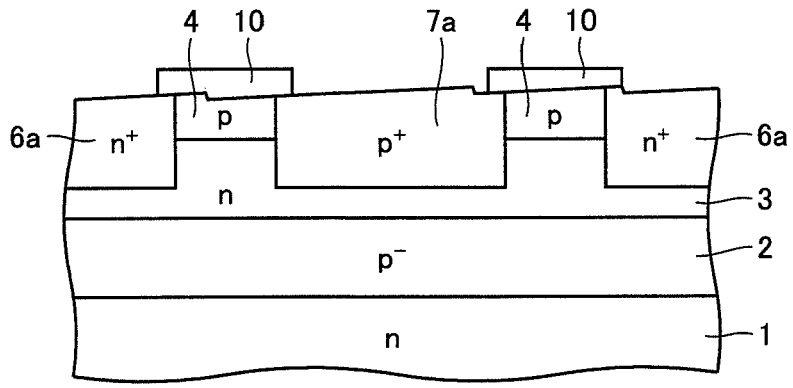
FIG. 10 is a schematic cross sectional view illustrating a part of manufacturing process of an example of the method of manufacturing the SiC semiconductor device of the present invention.

Thereafter a plurality of openings are provided in a part of field oxide film 10 using a photolithography technique to expose the surface of n$^+$ layer 6a or the surface of p$^+$ layer 7a from the opening of field oxide film 10, as shown in the schematic cross sectional view in FIG. 10.

Figure 11:
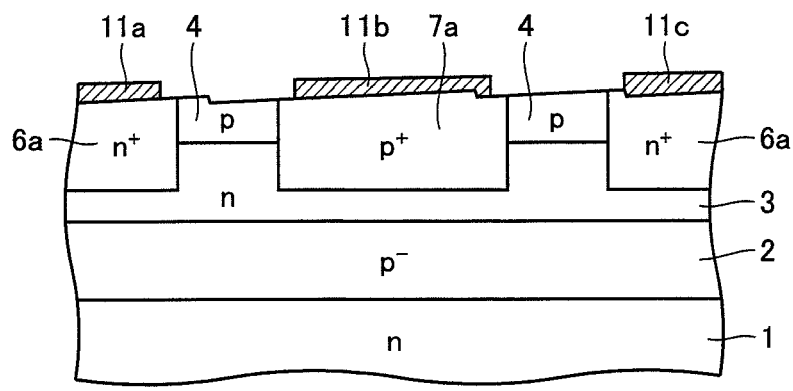
FIG. 11 is a schematic cross sectional view illustrating a part of manufacturing process of an example of the method of manufacturing the SiC semiconductor device of the present invention.

Subsequently ohmic electrodes 11a, 11b and 11c, made for example of nickel, are formed on the surfaces of n$^+$ layer 6a and the surface of p$^+$ layer 7a, using a lift-off method and the like, as shown in the schematic cross sectional view in FIG. 11.

Figure 12:
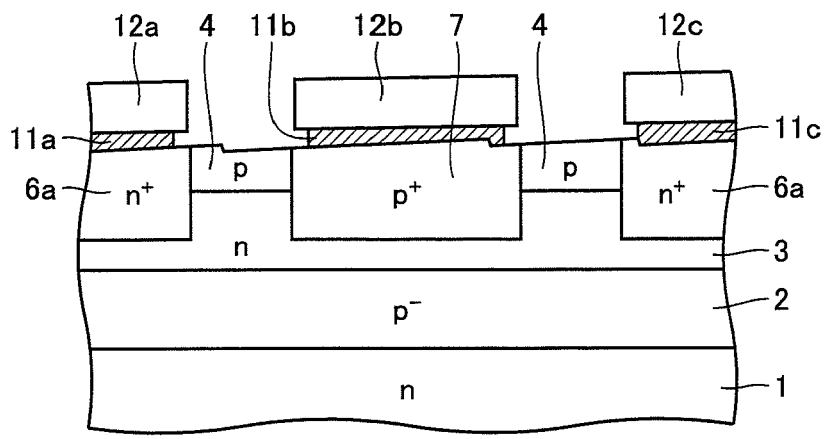
FIG. 12 is a schematic cross sectional view illustrating a part of manufacturing process of an example of the method of manufacturing the SiC semiconductor device of the present invention.

Then as shown in the schematic cross sectional view in FIG. 12, a source electrode 12a, made for example of aluminum, is formed on ohmic electrode 11a using the lift-off method and the like, a gate electrode 12b, made for example of aluminum, is formed on ohmic electrode 11b, and a drain electrode 12c, made for example of aluminum, is formed on ohmic electrode 11c.

By dividing the wafer, on which source electrode 12a, gate electrode 12b and drain electrode 12c are formed, into individual elements, a junction field effect transistor as an SiC semiconductor device can then be obtained.

When the junction field effect transistor is obtained in this way the diamond-like carbon film is not used in the manufacturing process. Therefore the junction field effect transistor is not polluted with carbon.

Moreover, the surface roughness caused by step bunching is suppressed in a stable manner in the junction field effect transistor obtained in this way, because the surface is recomposed utilizing the Si film. Therefore the development of the carrier trap, the leak path or the electric field concentration resulting from surface roughness can be suppressed in this junction field effect transistor, such that the junction field effect transistor has improved reliability.

Embodiment 2

Another example of a method of manufacturing a junction field effect transistor which is an example of an SiC semiconductor device will be described hereafter. This embodiment is characterized in that activation annealing and surface recomposition of the p type SiC layer using an Si film are performed in one step.

Figure 2:
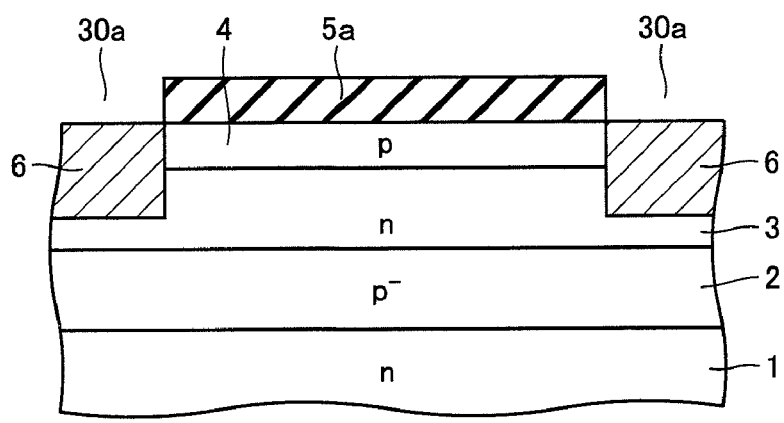
FIG. 2 is a schematic cross sectional view illustrating a part of manufacturing process of an example of the method of manufacturing the SiC semiconductor device of the present invention.
Figure 3:
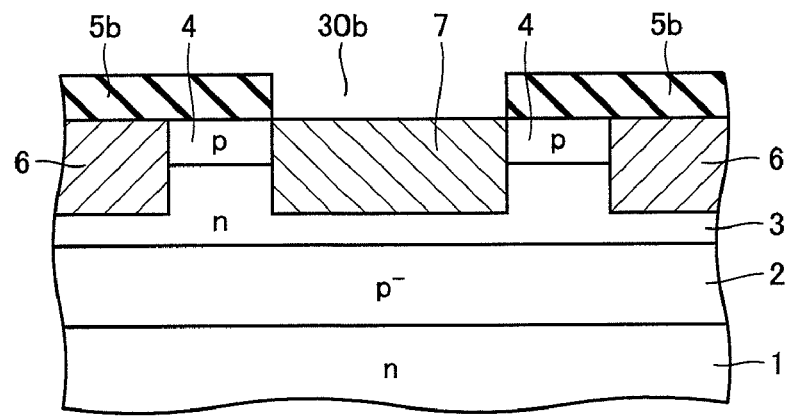
FIG. 3 is a schematic cross sectional view illustrating a part of manufacturing process of an example of the method of manufacturing the SiC semiconductor device of the present invention.

First, as shown in FIGS. 1-3, p$^-$ type SiC layer 2, n type SiC layer 3 and p type SiC layer 4 are grown epitaxially in this order on SiC substrate 1, then ion implanted region 6 with an n type dopant and ion implanted region 7 with an p type dopant are formed in a part of a surface of p type SiC layer 4 through ion implantation, and then ion implantation stopper film 5b is removed thereafter. The process so far is the same as that of Embodiment 1.

Figure 13:
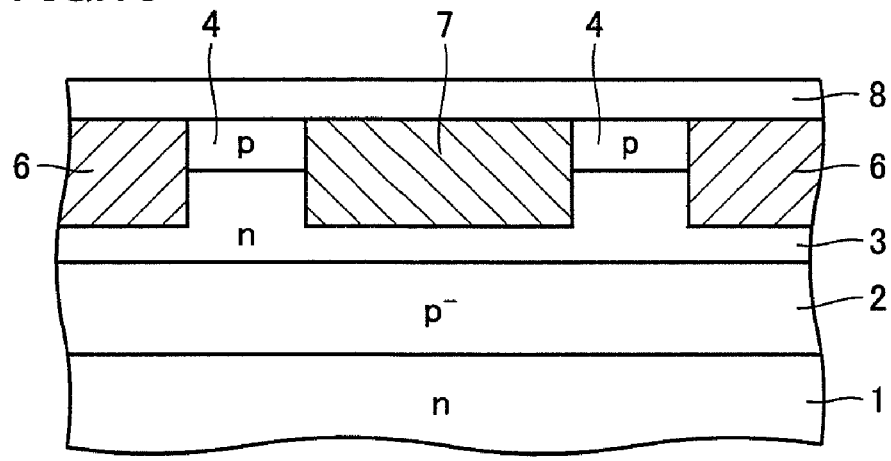
FIG. 13 is a schematic cross sectional view illustrating a part of manufacturing process of another example of the method of manufacturing the SiC semiconductor device of the present invention.
Figure 14:
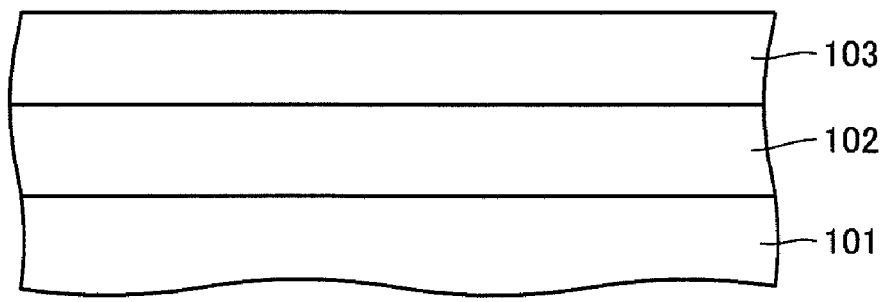
FIG. 14 is a schematic cross sectional view illustrating a part of manufacturing process of an example of a conventional method of manufacturing an SiC semiconductor device.
Figure 15:
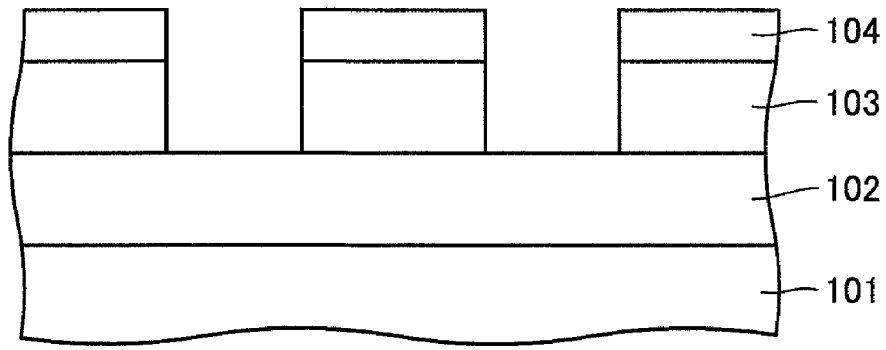
FIG. 15 is a schematic cross sectional view illustrating a part of manufacturing process of an example of a conventional method of manufacturing an SiC semiconductor device.
Figure 16:
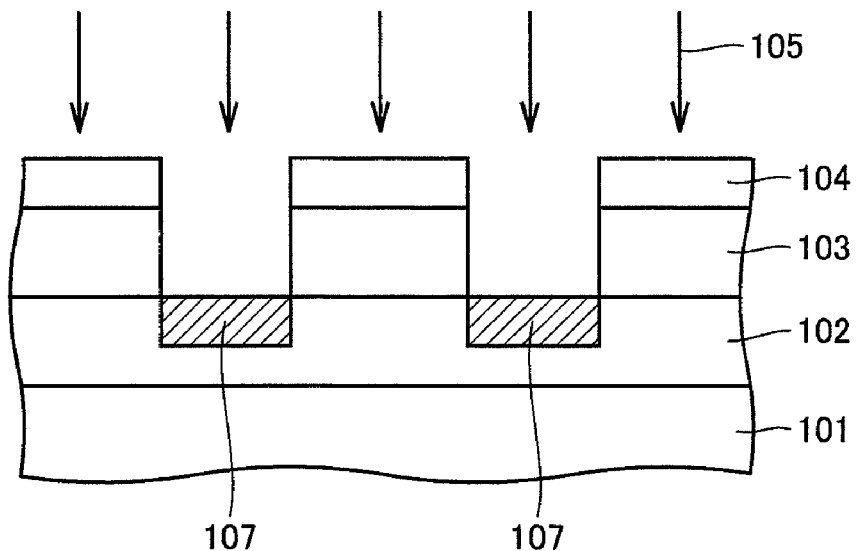
FIG. 16 is a schematic cross sectional view illustrating a part of manufacturing process of an example of a conventional method of manufacturing an SiC semiconductor device.
Figure 17:
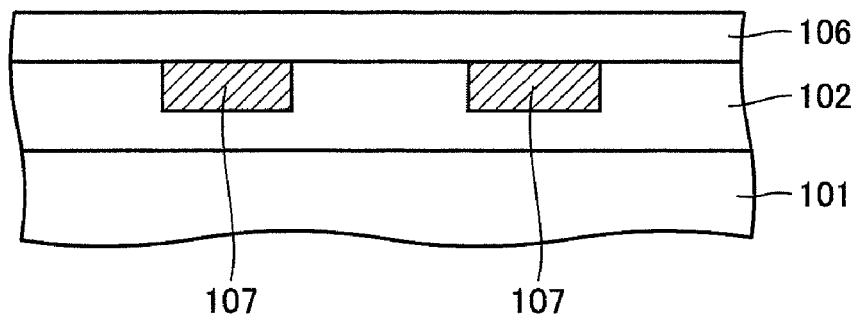
FIG. 17 is a schematic cross sectional view illustrating a part of manufacturing process of an example of a conventional method of manufacturing an SiC semiconductor device.
Figure 18:
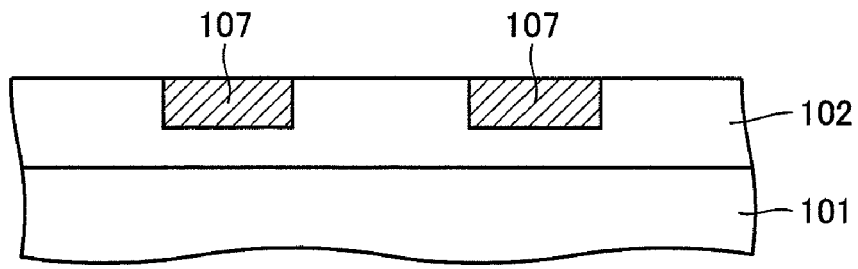
FIG. 18 is a schematic cross sectional view illustrating a part of manufacturing process of an example of a conventional method of manufacturing an SiC semiconductor device.

As shown in the schematic cross sectional view in FIG. 13, Si film 8 is formed for example by the sputtering method on the surfaces of ion implanted region 6 with an n type dopant, ion implanted region 7 with an p type dopant and p type SiC layer 4.

Subsequently, in an inert gas atmosphere, for example argon, Si film 8 and ion implanted region 6, ion implanted region 7 and p type SiC layer 4, on which Si film 8 is formed, are heated to a temperature not less than a melting temperature of Si film 8 and not less than a temperature at which the dopant implanted through ion implantation is activated. For example, Si film 8 and ion implanted region 6, ion implanted region 7 and p type SiC layer 4, on which Si film 8 is formed, can be heated to a temperature not less than 1500° C. and not more than 1800° C.

Figure 6:
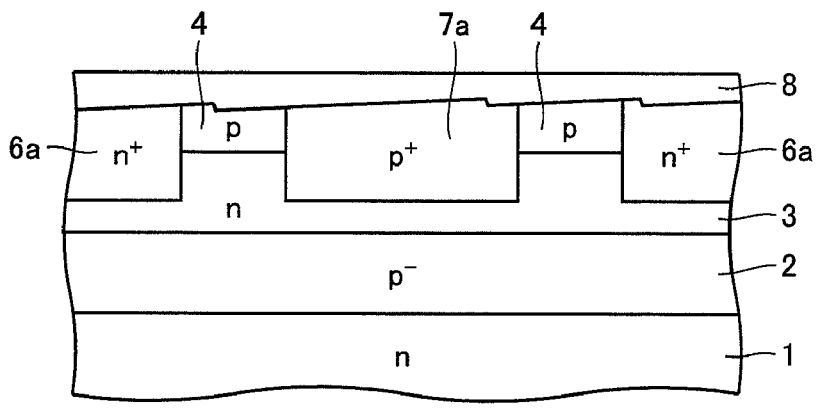
FIG. 6 is a schematic cross sectional view illustrating a part of manufacturing process of an example of the method of manufacturing the SiC semiconductor device of the present invention.

Thus activation of the dopant implanted through the ion implantation and recomposition of the surface of p type SiC layer 4 using melted Si film 8 are performed, such that the surface roughness on the surface of p type SiC layer 4 caused by step bunching after activation annealing is suppressed, and the surface of p type SiC layer 4 turns into a step-like smooth surface, for example as shown in FIG. 6, ion implanted region 6 with an n type dopant becomes $n^+$ layer 6a which functions as an n type layer, and ion implanted region 7 with an p type dopant becomes $p^+$ layer 7a which functions as a p type layer.

Thereafter, by performing the same process as in Embodiment 1 as shown in FIGS. 7-12, the junction field effect transistor as an SiC semiconductor device is obtained.

In this embodiment, since activation annealing and surface recomposition of the SiC single crystal using the Si film can be performed in one step, it is possible to manufacture the SiC semiconductor device more efficiently. Description is otherwise the same as in Embodiment 1.

EXAMPLE

First of all, a $p^-$ type SiC layer composed of a p type 4H—SiC single crystal (layer thickness: 10 μm, carrier concentration: $1 \times 10^{16}$ $cm^{-3}$), an n type SiC layer composed of an n type 4H—SiC single crystal (layer thickness: 0.4 μm, carrier concentration: $2 \times 10^{17}$ $cm^{-3}$) and a p type SiC layer composed of a p type 4H—SiC single crystal (layer thickness: 0.3 μm, carrier concentration: $2 \times 10^{17}$ $cm^{-3}$) were grown epitaxially in this order, by a CVD (Chemical Vapor Deposition) method, on a surface of an SiC substrate which is an 8° off-axis (0001) Si plane, composed of a p type 4H—SiC single crystal.

Next, an aluminum film was vapor-deposited by the EB (Electron Beam) vapor deposition method to a thickness of 3 μm on the surface of the p type SiC layer. Then a photoresist film patterned to have an opening in a predetermined region was formed on the aluminum film using the photolithography technique. The aluminum film exposed through the opening was then etched by a wet etching to expose the surface of the p type SiC layer through the opening. Subsequently, by completely removing the photoresist film, an ion implantation stopper film composed of an aluminum film having an opening in a predetermined region was formed.

Subsequently, ions of phosphorus, which is an n type dopant, were ion implanted in the opening of the above-mentioned ion implantation stopper film. The phosphorus ions were implanted with acceleration energy of 50-300 keV and a dose amount of $1 \times 10^{14}$ $cm^{-2}$. The ion implantation stopper film was completely removed by the wet etching after the ion implantation.

An aluminum film was again vapor-deposited by the EB vapor deposition method to a thickness of 3 μm on the surfaces of the phosphorus ion implanted region and the p type SiC layer. Then a photoresist film patterned to have an opening in a place which is different from the above-mentioned region was formed on the aluminum film using the photolithography technique. The aluminum film exposed through the opening was then etched by the wet etching to expose the surface of the p type SiC layer through the opening. Subsequently, by completely removing the photoresist film, an ion implantation stopper film implemented by an aluminum film having an opening in a place which is different from the phosphorus ion implanted region was formed.

Subsequently, ions of aluminum, which is a p type dopant, were ion implanted in the opening of the above-mentioned ion implantation stopper film. The aluminum ions were implanted with acceleration energy of 40-300 keV and a dose amount of $4 \times 10^{14}$ $cm^{-2}$. The ion implantation stopper film was completely removed by the wet etching after the ion implantation.

After the above-mentioned ion implantation, by heating the phosphorus ion implanted region, the aluminum ion implanted region and the p type SiC layer to a temperature of 1500° C.-1800° C. in an argon atmosphere to conduct activation annealing, phosphorus and aluminum which had been ion implanted were activated, such that the phosphorus ion implanted region became an $n^+$ layer and the aluminum ion implanted region became a $p^+$ layer.

An Si film was then formed to a thickness of 0.1 μm by the sputtering method on the surfaces of the $n^+$ layer, the $p^+$ layer and the p type SiC layer after activation annealing. Subsequently by heating the Si film, and the $n^+$ layer, the $p^+$ layer and the p type SiC layer, on which the Si film was formed, to a temperature of 1300° C.-1700° C. in an argon atmosphere, the surfaces of the $n^+$ layer, the $p^+$ layer and the p type SiC layer were recomposed and the surfaces of the $n^+$ layer, the $p^+$ layer and the p type SiC layer turned from a rough condition after activation annealing caused by step bunching into a condition of a step-like smooth surface. After recomposition of the surfaces of the $n^+$ layer, the $p^+$ layer and the p type SiC layer, the Si film was removed completely by being immersed in nitric acid/hydrogen fluoride solution.

Subsequently, by heating the surfaces of the $n^+$ layer, the $p^+$ layer and the p type SiC layer, after removing the Si film, a sacrifice oxide film was formed on the surfaces of the $n^+$ layer, the $p^+$ layer and the p type SiC layer, for 90 minutes at 1150° C. in an oxygen atmosphere. The sacrifice oxide film on the surfaces of the $n^+$ layer, the $p^+$ layer and the p type SiC layer was then removed by being immersed in nitric acid/hydrogen fluoride solution.

By heating the surfaces of the $n^+$ layer, the $p^+$ layer and the p type SiC layer, after removing the sacrifice oxide film, a field oxide film was then formed in the surfaces of the $n^+$ layer, the $p^+$ layer and the p type SiC layer, for 40 minutes at 1300° C. in an oxygen atmosphere.

A plurality of openings were provided in a part of the field oxide film using the photolithography technique to expose the surface of the $n^+$ layer or the surface of the $p^+$ layer through the opening of the field oxide film. Then a nickel film with a thickness of 0.1 μm was vapor-deposited by the EB vapor deposition method on the surfaces of the field oxide film, the $n^+$ layer and the $p^+$ layer. After a part of the vapor-deposited nickel film was removed by the lift-off method, an ohmic electrode implemented by the nickel film was formed on the surface of the $n^+$ layer and the surface of the $p^+$ layer by performing heat treatment for 2 minutes at 1000° C. in an argon atmosphere.

A photoresist film, which has an opening in a place corresponding to the place where the above-mentioned ohmic electrode was formed, was then formed using the photolithography technique. An aluminum film with a thickness of 1.5 μm was vapor-deposited by the EB vapor deposition method on the entire surface of the photoresist film.

By removing a part of the vapor-deposited aluminum film by the lift-off method, a source electrode or a drain electrode was formed on the ohmic electrode on the surface of the $n^+$ layer, and a gate electrode was formed on the ohmic electrode on the surface of the $p^+$ layer.

A junction field effect transistor as an SiC semiconductor device was obtained by dividing the wafer, on which the source electrode, the gate electrode and the drain electrode are formed, into individual elements.

It was confirmed that the junction field effect transistor obtained in this example was free from pollution with carbon, while the surface roughness caused by step bunching being suppressed. Therefore, the junction field effect transistor obtained in this example is considered to be highly reliable because it can reduce the development of the carrier trap, the leak path or the electric field concentration resulting from the surface roughness.

The embodiments and examples disclosed herein are by way of example in all respects and should not be interpreted as restrictive. The scope of the present invention is determined not by the above description but by the appended claims, and intended to include all the modifications within the meaning and the scope equivalent to those of the claims.

INDUSTRIAL APPLICABILITY

According to the present invention, it is possible to provide a method of manufacturing an SiC semiconductor device free from pollution with carbon, while suppressing a surface roughness caused by step bunching in a stable manner.

The invention claimed is:

1. A method of manufacturing a silicon carbide semiconductor device comprising the steps of:
    growing at least two layers of a silicon carbide single crystal;
    ion implanting a dopant in at least a part of a surface of the silicon carbide single crystal;
    forming a silicon film on the surface of ion-implanted said silicon carbide single crystal; and
    heating said silicon carbide single crystal on which said silicon film is formed to a temperature not less than a melting temperature of said silicon film.

2. A method of manufacturing a silicon carbide semiconductor device comprising the steps of:
    growing at least two layers of a silicon carbide single crystal;
    ion implanting a dopant in at least a part of a surface of the silicon carbide single crystal;
    forming a silicon film on the surface of ion-implanted said silicon carbide single crystal; and
    heating said silicon carbide single crystal on which said silicon film is formed to a temperature not less than a melting temperature of said silicon film and not less than a temperature at which the dopant implanted through ion implantation is activated.

* * * * *